(12) United States Patent
Seibel, II et al.

(10) Patent No.: US 9,318,669 B2
(45) Date of Patent: Apr. 19, 2016

(54) METHODS OF DETERMINING AND MAKING RED NITRIDE COMPOSITIONS

(75) Inventors: Harry A. Seibel, II, Morrisville, NC (US); Brian T. Collins, Holly Springs, NC (US)

(73) Assignee: Cree, Inc., Durham, NC (US)

( * ) Notice: Subject to any disclaimer, the term of this patent is extended or adjusted under 35 U.S.C. 154(b) by 770 days.

(21) Appl. No.: 13/361,276

(22) Filed: Jan. 30, 2012

(65) Prior Publication Data
US 2013/0193836 A1    Aug. 1, 2013

(51) Int. Cl.
| | | |
|---|---|---|
| *H01J 1/62* | (2006.01) | |
| *H01L 33/50* | (2010.01) | |
| *G01J 3/28* | (2006.01) | |
| *C09K 11/08* | (2006.01) | |
| *C09K 11/77* | (2006.01) | |

(52) U.S. Cl.
CPC .......... *H01L 33/504* (2013.01); *C09K 11/0883* (2013.01); *C09K 11/7734* (2013.01); *C09K 11/7774* (2013.01); *G01J 3/28* (2013.01)

(58) Field of Classification Search
CPC ..... C09K 11/08; H01L 33/502; H01L 33/504
See application file for complete search history.

(56) References Cited

U.S. PATENT DOCUMENTS

| | | | |
|---|---|---|---|
| 4,918,497 A | 4/1990 | Edmond | |
| 4,966,862 A | 10/1990 | Edmond | |
| 5,027,168 A | 6/1991 | Edmond | |
| 5,210,051 A | 5/1993 | Carter, Jr. | |
| 5,338,944 A | 8/1994 | Edmond et al. | |
| 5,359,345 A | 10/1994 | Hunter | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond et al. | |
| 5,631,190 A | 5/1997 | Negley | |
| 5,739,554 A | 4/1998 | Edmond et al. | |
| 5,912,477 A | 6/1999 | Negley | |
| 6,120,600 A | 9/2000 | Edmond et al. | |
| 6,187,606 B1 | 2/2001 | Edmond et al. | |
| 6,201,262 B1 | 3/2001 | Edmond et al. | |

(Continued)

OTHER PUBLICATIONS

Watanabe et al., "Crystal Structure and Luminescence Properties of $Sr_xCa_{1-x}AlSiN_3$:$Eu^{2+}$ Mixed Nitride Phosphors," Journ. Alloy and Compound, 475, Aug. 23, 2008, pp. 434-439.

(Continued)

*Primary Examiner* — Andrew Coughlin
(74) *Attorney, Agent, or Firm* — Myers Bigel & Sibley, P.A.

(57) ABSTRACT

Provided according to embodiments of the invention are methods of making a $Ca_{1-x-y}Sr_xEu_yAlSiN_3$ phosphor composition that include selecting a Color Rendering Index (CRI) R9 value, determining an Eu concentration based on predetermined values to obtain the selected CRI R9 value and making the $Ca_{1-x-y}Sr_xEu_yAlSiN_3$ phosphor having the determined Eu concentration. Also provided are methods for determining concentrations of Eu in a $Ca_{1-x-y}Sr_xEu_yAlSiN_3$ phosphor that will achieve a CRI R9 value. Related computer products are also disclosed.

26 Claims, 4 Drawing Sheets

| Eu Concentration | Emission Wavelength | Relative Brightness | General CRI | CRI R9 | Potency Rank |
|---|---|---|---|---|---|
| 0.003-0.007 | 630nm | 100% | 85 | 20 | 4 |
| 80 % increase | 630nm | 106% | 84 | 10 | 3 |
| 200+% increase | 630nm | 109% | 83 | 0 | 2 |
| 300% increase | 640nm | 75% | 90 | 45 | 1 |

(56) References Cited

U.S. PATENT DOCUMENTS

| | | |
|---|---|---|
| 6,600,175 B1 | 7/2003 | Baretz et al. |
| 6,791,119 B2 | 9/2004 | Slater, Jr. et al. |
| 6,853,010 B2 | 2/2005 | Slater, Jr. et al. |
| 6,958,497 B2 | 10/2005 | Emerson et al. |
| 7,095,056 B2 | 8/2006 | Vitta et al. |
| 7,213,940 B1 | 5/2007 | Van De Ven et al. |
| 7,456,499 B2 | 11/2008 | Loh et al. |
| 7,476,337 B2 | 1/2009 | Sakane et al. |
| 7,507,354 B2 | 3/2009 | Oshio |
| 7,564,180 B2 | 7/2009 | Brandes |
| 2006/0221272 A1 | 10/2006 | Negley et al. |
| 2007/0007494 A1 | 1/2007 | Hirosaki et al. |
| 2007/0139923 A1 | 6/2007 | Negley et al. |
| 2007/0158668 A1 | 7/2007 | Tarsa et al. |
| 2007/0170447 A1 | 7/2007 | Negley et al. |
| 2007/0223219 A1 | 9/2007 | Medendorp, Jr. et al. |
| 2007/0253209 A1 | 11/2007 | Loh et al. |
| 2008/0012036 A1 | 1/2008 | Loh et al. |
| 2008/0121921 A1 | 5/2008 | Loh et al. |
| 2008/0173884 A1 | 7/2008 | Chitnis et al. |
| 2008/0179611 A1 | 7/2008 | Chitnis et al. |
| 2008/0198112 A1 | 8/2008 | Roberts |
| 2008/0212305 A1 | 9/2008 | Kawana et al. |
| 2008/0283864 A1 | 11/2008 | LeToquin et al. |
| 2008/0303410 A1 | 12/2008 | Kaneda et al. |
| 2008/0308825 A1 | 12/2008 | Chakraborty et al. |
| 2009/0050907 A1 | 2/2009 | Yuan et al. |
| 2009/0050908 A1 | 2/2009 | Yuan et al. |
| 2009/0080185 A1 | 3/2009 | McMillan |
| 2009/0108281 A1 | 4/2009 | Keller et al. |
| 2009/0184616 A1 | 7/2009 | Van De Ven et al. |
| 2009/0243467 A1* | 10/2009 | Shimizu et al. ............. 313/503 |
| 2010/0123104 A1 | 5/2010 | Collins et al. |
| 2010/0252851 A1 | 10/2010 | Emerson et al. |
| 2011/0006334 A1 | 1/2011 | Ishii et al. |

OTHER PUBLICATIONS

U.S. Appl. No. 13/152,863, filed Jun. 3, 2011; entitled Red Nitride Phosphors.

U.S. Appl. No. 13/153,155, filed Jun. 3, 12011; entitled Methods of Determining and Making Red Nitride Compositions.

Ohno, Yoshi, "Color Rendering and Luminous Efficacy of White LED Spectra," Fourth International Conference on Solid State Lighting, Proc. of SPIE, vol. 5530, pp. 88-98, 2004.

* cited by examiner

| Eu Concentration | Emission Wavelength | Relative Brightness | General CRI | CRI R9 | Potency Rank |
|---|---|---|---|---|---|
| 0.003-0.007 | 630nm | 100% | 85 | 20 | 4 |
| 80 % increase | 630nm | 106% | 84 | 10 | 3 |
| 200+% increase | 630nm | 109% | 83 | 0 | 2 |
| 300% increase | 640nm | 75% | 90 | 45 | 1 |

METHODS OF DETERMINING AND MAKING RED NITRIDE COMPOSITIONS

BACKGROUND

Light emitting diodes ("LEDs") are well known solid state lighting devices that are capable of generating light. LEDs generally include a plurality of semiconductor layers that may be epitaxially grown on a semiconductor or non-semiconductor substrate such as, for example, sapphire, silicon, silicon carbide, gallium nitride or gallium arsenide substrates. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will "collide" with a hole and recombine. When this occurs, a photon of light can be emitted, which is how LEDs generate light. The wavelength distribution of the light generated by an LED generally depends on the semiconductor materials used and the structure of the thin epitaxial layers that make up the "active region" of the device (i.e., the area where the electrons and holes recombine).

LEDs typically have a narrow wavelength distribution that is tightly centered about a "peak" wavelength (i.e., the single wavelength where the radiometric emission spectrum of the LED reaches its maximum as detected by a photo-detector). For example, the spectral power distribution of a typical LED may have a full width of, for example, about 10-30 nm, where the width is measured at half the maximum illumination (referred to as the full width half maximum or "FWHM" width). Accordingly, LEDs are often identified by their "peak" wavelength or, alternatively, by their "dominant" wavelength. The dominant wavelength of an LED is the wavelength of monochromatic light that has the same apparent color as the light emitted by the LED as perceived by the human eye. Thus, the dominant wavelength differs from the peak wavelength in that the dominant wavelength takes into account the sensitivity of the human eye to different wavelengths of light.

As most LEDs are almost monochromatic light sources that appear to emit light having a single color, LED lamps that include multiple LEDs that emit light of different colors have been used in order to provide solid state light emitting devices that generate white light. In these devices, the different colors of light emitted by the individual LED chips combine to produce a desired intensity and/or color of white light. For example, by simultaneously energizing red, green and blue light emitting LEDs, the resulting combined light may appear white, or nearly white, depending on the relative intensities of the source red, green and blue LEDs.

LEDs are used in a host of applications including, for example, backlighting for liquid crystal displays, indicator lights, automotive headlights, flashlights, specialty lighting applications and even as replacements for conventional incandescent and/or fluorescent lighting in general lighting and illumination applications. In many of these applications, it may be desirable to provide a lighting source that generates light having specific properties.

SUMMARY

Some embodiments of the present invention are directed to light emitting devices that include a solid state lighting source, a first phosphor composition that is configured to emit first emitted light at a first emission wavelength that is different from a wavelength of light emitted from the solid state lighting source, and a second phosphor composition that is configured to emit second emitted light at a second emission wavelength that is different from the first emission wavelength and that is different from the wavelength of the light emitted from the solid state lighting source, the second phosphor composition including an activator concentration that results in a specific saturated color coefficient value of a combined emission of the light emitted from the solid state lighting source, the first emitted light and the second emitted light.

Some embodiments provide that the second phosphor includes a $Ca_{1-x-y}Sr_xEu_yAlSiN_3$ phosphor composition. In some embodiments, y is in a range from about 0 to about 0.025, and the specific saturated color coefficient value comprises a Color Rendering Index (CRI) R9 value in a range of about 70 to about 0. Some embodiments provide that the $Ca_{1-x-y}Sr_xEu_yAlSiN_3$ phosphor composition emits light including a wavelength at peak frequencies of emitted light of about 630 nm, wherein y is in a range of about 0.002 to about 0.007, and wherein the specific saturated color coefficient value comprises a Color Rendering Index (CRI) R9 value of about 20. In some embodiments, an about eighty percent increase in y corresponds to about a fifty percent decrease in the CRI R9 value. Some embodiments provide that an about two hundred percent increase in y corresponds to about a one hundred percent decrease in the CRI R9 value.

Some embodiments provide that the $Ca_{1-x-y}Sr_xEu_yAlSiN_3$ phosphor composition emits light including a wavelength at peak frequencies of emitted light of about 630 nm and y is in a range of about 0.005 to about 0.012, and that the specific saturated color coefficient value comprises a Color Rendering Index (CRI) R9 value in a range of about 20 to about zero as a function of y.

In some embodiments, the activator comprises Eu and the specific saturated color coefficient value comprises a Color Rendering Index (CRI) R9 value. Some embodiments provide that the Eu concentration is negatively correlated with the CRI R9 value.

Some embodiments provide that the specific saturated color coefficient value corresponding to the second phosphor composition is determined by estimating a diffuse reflectance of the phosphor composition and a wavelength at peak frequencies of light emitted by the second phosphor composition.

In some embodiments, the activator concentration of the second phosphor composition is determined by estimating a diffuse reflectance of the second phosphor composition and a wavelength at peak frequencies of light emitted by the second phosphor composition.

Some embodiments provide that the activator concentration is determined based on predetermined values selected to obtain the specific saturated color coefficient value. Some embodiments provide that an increase in the specific saturated color coefficient value corresponds to a decrease in a potency of the second phosphor composition that determines a conversion efficiency of the second phosphor composition. In some embodiments, a load factor that corresponds to a relative amount of the second phosphor in the device is negatively correlated to an Eu concentration in the second phosphor to provide a substantially same specific saturated color coefficient value.

Some embodiments provide that a same desired specific saturated color coefficient value corresponds to less of the second phosphor with a lower activator concentration than the second phosphor with a greater activator concentration. In some embodiments, the $Ca_{1-x-y}Sr_xEu_yAlSiN_3$ phosphor composition emits light including a wavelength at peak frequencies of emitted light of about 630 nm, the specific saturated color coefficient value comprises a Color Rendering Index (CRI) R9 value, and a reduction of y of about 0.001 corresponds to an increase of the CRI R9 value in a range of about 3 to about 5 as a function of y.

In some embodiments, the light emitted from the solid state lighting source includes a dominant wavelength in a range of about 380 to about 470 nm, and the second emission wavelength includes a dominant wavelength in a range of about 530 to about 565 nm.

Some embodiments of the present invention include methods of making a $Ca_{1-x-y}Sr_xEu_yAlSiN_3$ phosphor composition. Such methods may include selecting a Color Rendering Index (CRI) R9 value, determining an Eu concentration of the $Ca_{1-x-y}Sr_xEu_yAlSiN_3$ phosphor composition based on predetermined values to obtain the CRI R9 value of a combination of light emitted from a solid state light emitter, a first phosphor that converts light from the solid state light emitter and the $Ca_{1-x-y}Sr_xEu_yAlSiN_3$ phosphor composition, and making the $Ca_{1-x-y}Sr_xEu_yAlSiN_3$ phosphor composition having the determined Eu concentration.

Some embodiments further include selecting a CRI R9 value before determining the Eu concentration. In some embodiments, determining the Eu concentration may include determining the Eu concentration based on predetermined values to obtain the selected CRI R9 value.

Embodiments may further include selecting a wavelength at peak frequencies of light emitted from the $Ca_{1-x-y}Sr_xEu_yAlSiN_3$ phosphor composition. Some embodiments provide that the wavelength at peak frequencies is in a range of about 610 nm to about 640 nm. Some embodiments provide that the wavelength at peak frequencies is in a range of about 620 nm to about 630 nm. In some embodiments, the $Ca_{1-x-y}Sr_xEu_y$-$AlSiN_3$ phosphor composition absorbs light at a wavelength in a range of 350 mn and 530 nm and emits peak frequencies at a wavelength in a range of 620 nm to 660 nm.

Some embodiments provide that the Eu concentration is negatively correlated with the CRI R9 value. In some embodiments, an increase in the CRI R9 value corresponds to a decrease in a potency of the phosphor composition that determines a conversion efficiency of the phosphor composition. Some embodiments provide that the $Ca_{1-x-y}Sr_xEu_yAlSiN_3$ phosphor composition emits light including a wavelength at peak frequencies of emitted light of about 630 nm, wherein y is in a range of about 0.003 to about 0.007, and wherein the CRI R9 value is about 20. In some embodiments, an about eighty percent increase in y corresponds to an about fifty percent decrease in the CRI R9 value. Some embodiments provide that an about two hundred percent increase in y corresponds to an about one hundred percent decrease in the CRI R9 value.

Some embodiments provide that the $Ca_{1-x-y}Sr_xEu_yAlSiN_3$ phosphor composition emits light including a wavelength at peak frequencies of emitted light of about 630 nm, wherein y is in a range of about 0.005 to about 0.012, and wherein the CRI R9 value is in a range of about 20 to about zero as a function of y.

Some embodiments of the present invention include light emitting devices that include a solid state lighting source, a first phosphor, and a second phosphor that includes a $Ca_{1-x-y}Sr_xEu_yAlSiN_3$ phosphor composition made according to operations in some methods described herein.

Some embodiments include methods of identifying a phosphor composition. Such methods may include estimating a diffuse reflectance of the phosphor composition, estimating a wavelength at peak frequencies of light emitted by the phosphor composition, and comparing the wavelength and the diffuse reflectance to values of known phosphor compositions to determine if the phosphor composition is one of the known phosphor compositions.

In some embodiments, estimating the diffuse reflectance comprises performing an ultraviolet-visible spectroscopy of the phosphor composition. Some embodiments further include estimating a potency of the phosphor composition that determines a conversion efficiency of the phosphor composition and comparing the potency to predetermined potency values of the known phosphor compositions to determine if the phosphor composition is the known phosphor composition.

Some embodiments include estimating a Color Rendering Index (CRI) R9 value corresponding to the phosphor composition in a device including a solid state light emitter and at least one other phosphor. In some embodiments, estimating the CRI R9 value comprises estimating the CRI R9 value of combined emission from the solid state light emitter, the at least one other phosphor and the phosphor composition.

Some embodiments include estimating an Eu concentration of the phosphor composition based on the diffuse reflectance of the phosphor composition and a wavelength at peak frequencies of light emitted by the phosphor composition.

Some embodiments of the present invention include light emitting devices that include a solid state lighting source, a first phosphor composition positioned to receive light emitted from the solid state lighting source and to emit first emitted light, and a second phosphor composition that is a $Ca_{1-x-y}Sr_xEu_yAlSiN_3$ phosphor composition that is configured to receive light that is emitted from the solid state lighting source and to emit second emitted light, the $Ca_{1-x-y}Sr_x$-$Eu_yAlSiN_3$ phosphor composition including an Eu concentration corresponding to a selected Color Rendering Index (CRI) R9 value of a combination of the light emitted from the solid state light emitter, the first emitted light and the second emitted light.

In some embodiments, the Eu concentration further corresponds to a selected potency of the phosphor composition that determines a conversion efficiency of the phosphor composition and as the Eu concentration increases, the selected potency increases and the CRI R9 value decreases.

Some embodiments provide that the $Ca_{1-x-y}Sr_xEu_yAlSiN_3$ phosphor composition emits light including a wavelength at peak frequencies of emitted light of about 630 nm and a y value is in a range of about 0.003 to about 0.015, and wherein the CRI R9 value is in a range of about 20 to about zero corresponding to the y value. In some embodiments, the Eu concentration is negatively correlated with the CRI R9 value.

In some embodiments, a diffuse reflectance of the phosphor composition and a wavelength at peak frequencies of light emitted by the phosphor composition correspond to the Eu concentration. Some embodiments provide that the $Ca_{1-x-y}Sr_xEu_yAlSiN_3$ phosphor composition emits light including a wavelength at peak frequencies of emitted light of about 630 nm, that y is in a range of about 0.003 to about 0.007, and that the CRI R9 value is in a range of about 18 to about 22. In some embodiments, an about eighty percent increase in y corresponds to an about fifty percent decrease in the CRI R9 value. Some embodiments provide that the combination of the light emitted from the solid state light emitter, the first emitted light and the second emitted light is visually indistinguishable from a center point of a region in two-dimensional color space and that the two-dimensional color space includes a 1931 CIE Chromaticity Diagram and wherein the center point corresponds to a ccx value in a range of about 0.335 to about 0.480 and a ccy value in a range of about 0.335 to about 0.435. In some embodiments, the center point corresponds to a ccx value in a range of about 0.414 to about 0.485 and a ccy value in a range of about 0.380 to about 0.435

Some embodiments of the present invention include computer program products for determining one or more concentrations of Eu in a $Ca_{1-x-y}Sr_xEu_yAlSiN_3$ phosphor that will achieve a selected Color Rendering Index R9 value in a device including a light emitter and another phosphor, the computer program product comprising a computer readable program code configured to correlate the selected CRI R9 value to the one or more Eu concentrations that will achieve the selected CRI R9 value based on predetermined values. Some embodiments provide that the computer readable program code is configured to correlate a wavelength at peak frequencies of emitted light and the CRI R9 value to Eu concentrations that will achieve the CRI R9 value and the selected wavelength at peak frequencies of emitted light based on predetermined values. In some embodiments, the predetermined values are stored in a look up table. Some embodiments provide that the predetermined values are calculated by a predetermined mathematical relationship.

Some embodiments provide that the $Ca_{1-x-y}Sr_xEu_yAlSiN_3$ phosphor composition absorbs light at a wavelength in a range of 350 nm and 530 nm and emits peak frequencies at a wavelength in a range of 620 nm to 660 nm. In some embodiments, the Eu concentration is negatively correlated with the CRI R9 value.

Some embodiments are directed to methods that include selecting a specific saturated color coefficient value of a combined emission of light emitted from a solid state lighting source, a first phosphor composition that is configured to emit first emitted light at a first emission wavelength that is different from a wavelength of light emitted from the solid state lighting source and a second phosphor composition that is configured to emit second emitted light at a second emission wavelength that is different from the first emission wavelength and that is different from the wavelength of the light emitted from the solid state lighting source. Such methods may include determining an activator concentration of the second phosphor composition based on predetermined values to obtain the specific saturated color coefficient value of the combined emission of light and making the second phosphor composition having the determined activator concentration.

In some embodiments, the second phosphor includes a $Ca_{1-x-y}Sr_xEu_yAlSiN_3$ phosphor composition and the specific saturated color coefficient value comprises a Color Rendering Index (CRI) R9 value in a range of about 0 to about 80. Some embodiments provide that the $Ca_{1-x-y}Sr_xEu_yAlSiN_3$ phosphor composition emits light including a wavelength at peak frequencies of emitted light of about 630 nm and that y is in a range of about 0.005 to about 0.015.

In some embodiments, the activator comprises Eu and the specific saturated color coefficient value comprises a Color Rendering Index (CRI) R9 value. Some embodiments provide that the Eu concentration is negatively correlated with the CRI R9 value.

In some embodiments, the specific saturated color coefficient value corresponding to the second phosphor composition is determined by estimating a diffuse reflectance of the phosphor composition and a wavelength at peak frequencies of light emitted by the second phosphor composition. Some embodiments provide that a load factor that corresponds to a relative amount of the second phosphor in the device is negatively correlated to an Eu concentration in the second phosphor to provide a substantially same specific saturated color coefficient value. In some embodiments, a same desired specific saturated color coefficient value corresponds to less of the second phosphor with a lower activator concentration than the second phosphor with a greater activator concentration. Some embodiments provide that the light emitted from the solid state lighting source includes a dominant wavelength in a range of about 380 to about 470 nm and that the second emission wavelength includes a dominant wavelength in a range of about 530 to about 565 nm.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

DETAILED DESCRIPTION

Figures 1, 2:
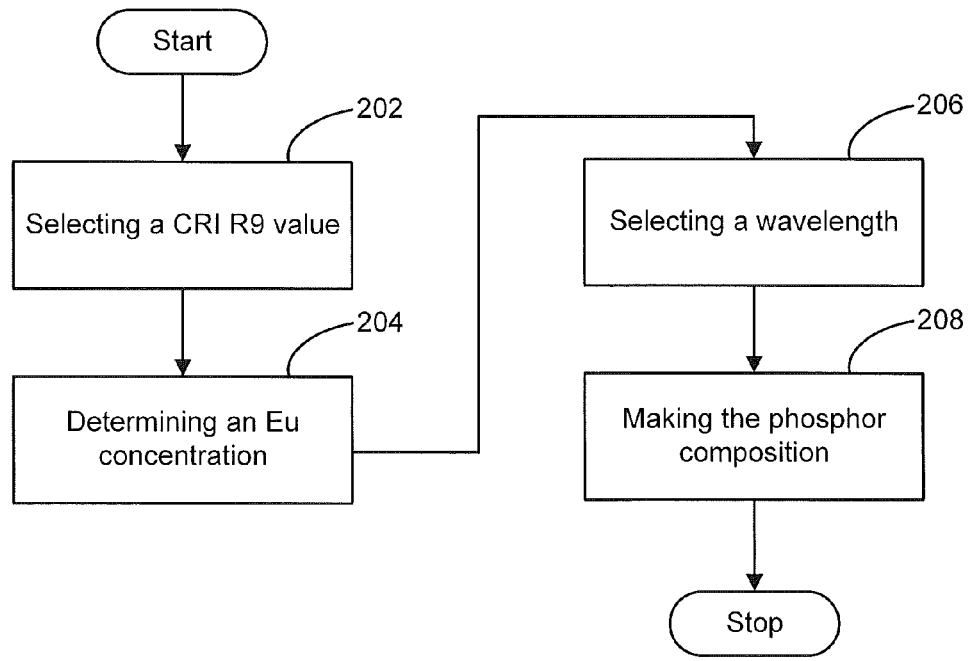
FIG. 1 is a is a block diagram illustrating operations for making a $Ca_{1-x-y}Sr_xEu_yAlSiN_3$ phosphor composition according to some embodiments of the present invention.
FIG. 2 is a table illustrating example performance values corresponding to different Eu concentrations in a phosphor composition according to some embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

All patents and patent applications referred to herein are incorporated by reference herein in their entirety. In case of conflicting terminology or scope, the present application is controlling.

As noted above, phosphors are one known class of luminescent materials. A phosphor may refer to any material that absorbs light at one wavelength and re-emits light at a different wavelength in the visible spectrum, regardless of the delay between absorption and re-emission and regardless of the wavelengths involved. Accordingly, the term "phosphor" may be used herein to refer to materials that are sometimes called fluorescent and/or phosphorescent. In general, phosphors may absorb light having first wavelengths and re-emit light having second wavelengths that are different from the first wavelengths. For example, "down-conversion" phosphors may absorb light having shorter wavelengths and re-emit light having longer wavelengths.

As used herein, the term "solid state light emitting device" may include a light emitting diode, laser diode and/or other semiconductor device which includes one or more semiconductor layers, which may include silicon, silicon carbide, gallium nitride and/or other semiconductor materials, an optional substrate which may include sapphire, silicon, silicon carbide and/or other microelectronic substrates, and one or more contact layers which may include metal and/or other conductive materials. The design and fabrication of solid state light emitting devices are well known to those skilled in the art. The expression "light emitting device," as used herein, is not limited, except that it be a device that is capable of emitting light.

Solid state light emitting devices according to embodiments of the invention may include III-V nitride (e.g., gallium nitride) based LEDs or lasers fabricated on a silicon carbide or gallium nitride substrates such as those devices manufactured and sold by Cree, Inc. of Durham, N.C. Such LEDs and/or lasers may (or may not) be configured to operate such that light emission occurs through the substrate in a so-called "flip chip" orientation. Solid state light emitting devices according to embodiments of the present invention include both vertical devices with a cathode contact on one side of the chip, and an anode contact on an opposite side of the chip and devices in which both contacts are on the same side of the device. Some embodiments of the present invention may use solid state light emitting devices, device packages, fixtures, luminescent materials/elements, power supplies, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918, 497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272.

Methods of Determining Sr and Eu Concentrations

Provided according to some embodiments of the invention are methods for determining concentrations of Sr and Eu in a $Ca_{1-x-y}Sr_xEu_yAlSiN_3$ phosphor that will achieve a relative color point. In some embodiments, the methods include (a) selecting the relative color point; and (b) determining one or more Eu and Sr concentrations that will achieve the selected relative color point based on predetermined values. In some embodiments, a relative brightness is also selected and the one or more Eu and Sr concentrations determined will achieve both the selected relative color point and the selected relative brightness.

The term "relative color point," as used herein, refers to the color point relative to the commercial red phosphor described in U.S. Publication No. 2007/0007494 and/or U.S. Publication No. 2010/0123104, the contents of which are hereby incorporated by reference. "Selecting" a relative color point includes identifying a particular relative color point, or range of relative color points, that one wishes to achieve with the $Ca_{1-x-y}Sr_xEu_yAlSiN_3$ phosphor.

The term "relative brightness," as used herein, refers to the brightness relative to the commercial red phosphor described in U.S. Publication No. 2007/0007494.

"Selecting" a relative brightness includes identifying a particular relative brightness, or range of relative brightness, that one wishes to achieve with the $Ca_{1-x-y}Sr_xEu_yAlSiN_3$ phosphor.

As discussed herein, the Color Rendering Index (CRI) refers to a quantitative measure of the ability of a light source to reproduce the colors of objects in comparison with an ideal or natural light source. In contrast with the correlated color temperature (CCT) that describes the apparent color of a light source, the CRI refers to the color appearance of objects that are illuminated by the light source. A commonly used CRI value is referred to as the general CRI and includes coefficients corresponding to eight medium saturated colors (R1-R8). However, the CRI (referred to as the special CRI) also includes coefficients corresponding to six highly saturated colors (R9-R14). Of these, R9 corresponds to a strong red color, which may affect a red-green contrast that may be beneficial in rendering colors.

Some embodiments of the disclosure herein arise from the realization that an activator concentration value used in phosphor compositions described herein may correlate to a specific CRI saturated color coefficient value. For example, some embodiments are directed to devices that include a solid state lighting source, a first phosphor composition that is configured to emit first emitted light at a first peak emission wavelength and a second phosphor composition that is configured to emit second peak emitted light at a second emission wavelength. The first peak emission wavelength, the second peak emission wavelength and the dominant wavelength of the light emitted from the solid state lighting source may all be different from one another.

The second phosphor composition may include an activator concentration that results in a specific Color Rendering Index saturated color coefficient value of a combined emission of the light emitted from the solid state lighting source, the first emitted light and the second emitted light. For example, specific Color Rendering Index saturated color coefficients may be associated with specific saturated colors including strong red (R9), strong yellow (R10), strong green (R11) and/or strong blue (R12), among others.

As discussed below in more detail, the second phosphor may include a $Ca_{1-x-y}Sr_xEu_yAlSiN_3$ phosphor composition, the activator includes Eu and the specific Color Rendering Index saturated color coefficient value comprises a CRI R9 value, however, the disclosure is not so limiting.

In some embodiments, the specific Color Rendering Index saturated color coefficient value corresponding to the second phosphor composition is determined by estimating a diffuse reflectance of the phosphor composition and a wavelength at peak frequencies of light emitted by the second phosphor composition. The activator concentration of the second phosphor composition may be determined by estimating a diffuse reflectance of the second phosphor composition and a wavelength at peak frequencies of light emitted by the second phosphor composition.

Some embodiments of the disclosure herein arise from the realization that an Eu concentration value used in phosphor compositions described herein may correlate to a CRI R9 value.

Provided according to some embodiments of the invention are methods for determining an Eu concentration in a $Ca_{1-x-y}Sr_xEu_yAlSiN_3$ phosphor that will achieve a CRI R9 value. For example, reference is made to FIG. 1, which is a block diagram illustrating operations for making a $Ca_{1-x-y}Sr_xEu_yAlSiN_3$ phosphor composition. Operations include selecting a CRI R9 value (block 202). Selecting a CRI R9 value includes identifying a particular CRI R9 value, or range of CRI R9 values, that one wishes to achieve with the $Ca_{1-x-y}Sr_xEu_yAlSiN_3$ phosphor.

The CRI R9 value corresponds to the combined emissions of emitting components in an emitting device. For example, white light may be produced by surrounding a single-color LED with a luminescent material that converts some of the light emitted by the LED to light of other colors. The combination of the light emitted by the single-color LED that passes through the wavelength conversion material along with the light of different colors that is emitted by the wavelength conversion material may produce a white or near-white light. For example, a single blue-emitting LED chip (e.g., made of indium gallium nitride and/or gallium nitride) may be used in combination with a yellow phosphor, polymer or dye such as for example, cerium-doped yttrium aluminum garnet (which has the chemical formula $Y_{3-x}Ce_xAl_5O_{12}$, and is commonly referred to as YAG:Ce), that "down-converts" the wavelength of some of the blue light emitted by the LED, changing its color to yellow. Blue LEDs made from indium gallium nitride exhibit high efficiency (e.g., external quantum efficiency as high as 60%). In a blue LED/yellow phosphor lamp, the blue LED chip produces an emission with a dominant wavelength of about 450-465 nanometers, and the yellow phosphor produces yellow fluorescence with a peak wavelength of about 545-565 nanometers in response to the blue emission. Some of the blue light passes through the yellow phosphor (and/or between the phosphor particles) without being down-converted, while a substantial portion of the light is absorbed by the yellow phosphor, which becomes excited and emits yellow light (i.e., the blue light is down-converted to yellow light). The combination of blue light and yellow light may appear white to an observer, but may be perceived as being cool white in color. The combined emission may be modified to provide "warm" white light by including red-emitting phosphors as described herein to increase the CRI R9 value.

In some embodiments, the red phosphors may include a red nitride that is a phosphor composition that absorbs in the blue portion of the visible spectrum and emits in the red portion of the visible spectrum. Some embodiments provide that the red phosphor may be combined with yellow phosphors. The light emitted from the yellow phosphors and the red phosphors may combine with blue light to produce a warm white light. Varying the amount of red phosphors may vary the warmth of the white light. In this regard, a yellow to red weight percent ratio may be determined to yield a particular color point, as may be defined in a mathematically defined color space. For example, in some embodiments, the warm white light may correspond to CIE 1931 E7 or E8 bins, among others.

Suitable phosphors that may be used in combination with the red phosphor may include, for example, $(Y_{1-x}Lu_x)_3(Al_{1-y}Ga_y)_5O_{12}$:Ce where x and y include values in a range from about 0 to about 1, $(Tb_{1-x}RE_x)_3Al_5O_{12}$:Ce phosphor (TAG), $(Ba_{1-x-y}Sr_xMg_y)_2SiO_4$:Eu (BOSE), SIALONs and other green to yellow emitting oxynitride phosphors, among others.

The phosphors may include a host compound material including, for example, any of $Ca_{1-x}Sr_xAlSiN_3$, $Ca_2Si_5N_8$, $Sr_2Si_5N_8$, $Ba_2Si_5N_8$, $BaSi_7N_{10}$, $BaYSi_4N_7$, $Y_5(SiO_4)_3N$, $Y_4Si_2O_7N_2$, $YSiO_2N$, $Y_2Si_3O_3N_4$, $Y_2Si_3$-x$AlxO_3$+x$N_4$-x, $Ca_{1.5}Si_9Al_3N_{16}$, $Y_{0.5}Si_9O_{1.5}N_{14.5}$, $CaSiN_2$, $Y_2Si_4N_6C$, and/or $Y_6Si_{11}N_{20}O$, among others. The luminescent compound may further include an activator material that is combined with the host compound material. The activator material may include, for example, any of Ce, Eu, Sm, Yb, Gd and/or Tb, among others.

The CRI R9 value corresponds to combined emissions from the LED, a non-red phosphor (e.g., a yellow phosphor) and a red phosphor. Some embodiments provide that the emissions from the LED and the non-red phosphor may represent a relatively static contribution to the CRI R9 value, while the variations in the composition and/or amount of the red phosphor may correspond to non-trivial changes in the CRI R9 value. Some embodiments provide that the CRI R9 contributions from the red phosphor may include emissions from the red phosphor from converting light received from the LED and one or more non-red-phosphors.

In some embodiments, the selected CRI R9 value is in a range of 0 to 70. Since the CRI R9 value corresponds to a strong red color, the color rendering performance of the red phosphor may be selected via the CRI R9 value. An Eu concentration may be determined based on predetermined values to obtain the CRI R9 value (block 204). For example, brief reference is made to FIG. 2, which is a table illustrating example performance values corresponding to different Eu concentrations in the red phosphor. The Table 220 includes columns corresponding to Eu concentration 222, emission wavelength 224, relative brightness 226, general CRI 228, CRI R9 230 and a potency ranking 232. Although specific values are provided herein (e.g., Eu concentration, emission wavelength, relative brightness, etc.), such values are non-limiting and are included merely by way of example for demonstrating the concepts described herein. As discussed herein, the relative values for CRI R9 loading and brightness correspond to the same color point.

As illustrated, the first three rows of data correspond to red phosphor compositions that emit light at a peak wavelength of about 630 nm (see column 224) when excited by received light including a peak wavelength of about 450 nm. As used herein, peak wavelength may refer to the wavelength at peak frequencies of the light emitted from the red phosphor responsive to receipt of light having a specific peak wavelength. Note that the Eu concentration 222 in a range of about 0.003 to about 0.007 may correspond to a CRI R9 value 230 in a range of about 15 to about 25. As the Eu concentration 222 increases by about eighty percent of the value in the 0.003 to about 0.007 range, the CRI R9 value 230 may decrease by about fifty percent (i.e., to a value in a range of about 7.5 to about 12.5.) As the Eu concentration 222 increases by about two hundred or more percent of the value in the 0.003 to about 0.007 range, the CRI R9 value 230 may decrease by about one hundred percent (i.e., to a value of about 0.) In this regard, the Eu concentration 222 and the CRI R9 values 230 are negatively correlated in that as the Eu concentration increases, the CRI R9 value decreases. As illustrated, the different CRI R9 (strong red) values 230 that differ all at the same emission wavelength 224 evidence the property distinction between the color of light emission and color rendering.

In addition to effecting a change of the CRI R9 value 230 of a light emitting device that includes the red phosphor, changing the Eu concentration 222 also provides correlative changes in the relative brightness 226 of the red phosphor, the general CRI 228 of the device that included the red phosphor, which corresponds to CRI coefficients R1-8, and the potency 232 of the red phosphor. Note that the general CRI and the CRI R9 may be relevant to a specific device type and/or configuration. As such, data corresponding to different ones of the red phosphors are based on substantially the same light emitter and other non-red phosphor compositions and/or configurations.

Returning the FIG. 1, an Eu concentration of the red phosphor composition is determined (block 204). In some embodiments, determining the Eu concentration is performed based on predetermined values of Eu concentration that are determined to correspond to the selected CRI R9 value. As used herein, predetermined values may be determined by correlations that may be obtained from precalculated values, or from predetermined mathematical relationships, which in some cases, may be shown in graphical form. In some embodiments, the predetermined values are stored in a look up table.

An emission wavelength is selected (block 206). For example, the CRI R9 values may deviate substantially between red phosphor compositions that emit light having different peak wavelengths. Brief reference is made to the table of FIG. 2 in which, data is provided for a red phosphor composition having an Eu concentration 222 and emitting light at a peak wavelength of about 640 nm (in contrast with 630 nm) when excited by received light including a peak wavelength of about 450 mn The corresponding CRI R9 value 230 is 45. Additionally, as illustrated in the potency rank 232, the red phosphor having the 640 nm emission wavelength is ranked more highly that the other listed red phosphor compositions having emission peak wavelengths of about 630 nm.

Although FIG. 2 only lists examples at emission wavelengths of 640 and 630 nm, such examples are non-limiting. In some embodiments, the peak wavelength is in a range of about 620 nm to about 650 nm. Some embodiments provide that the peak wavelength is in a range of about 630 nm to about 640 nm. In some embodiments, the $Ca_{1-x-y}Sr_xEu_y$-$AlSiN_3$ red phosphor composition absorbs light at a wavelength in a range of 350 nm and 530 mn and emits light having a peak wavelength in a range of 620 nm to 660 nm.

Once the Eu concentration is determined based at least on the desired CRI R9 value; the $Ca_{1-x-y}Sr_xEu_yAlSiN_3$ red phosphor composition having the determined Eu concentration is made (block 208). Some embodiments provide that the Eu concentration is determined based on multiple factors in addition to the CRI R9 value. For example, an increase in the CRI R9 value corresponds to a decrease in a potency of the red phosphor composition that determines a conversion efficiency of the red phosphor composition. In this regard, product considerations may include an approach that determines the Eu concentration based on the CRI R9 value as weighted against desired potency.

Figure 3:
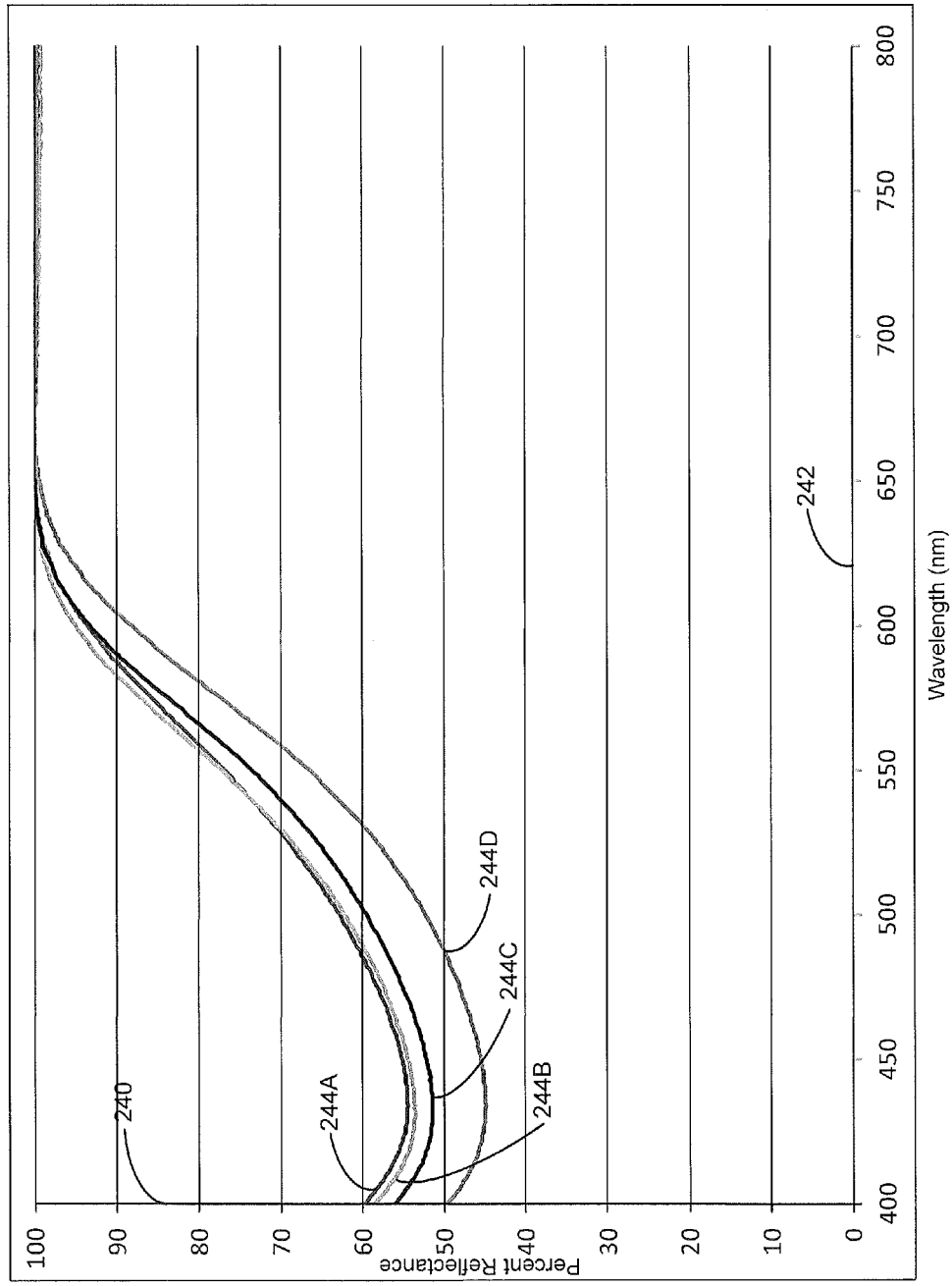
FIG. 3 is a graph illustrating plots of the percent reflectance versus the wavelength of light of example phosphor compositions according to some embodiments of the present invention.

Some embodiments include identifying red phosphor compositions using measured data including the diffuse reflectance. For example, reference is now made to FIG. 3, which is a graph of the percent reflectance versus the wavelength of light corresponding to examples of red phosphor compositions disclosed herein. The vertical axis 240 is the percent reflectance and the horizontal axis 242 is the wavelength in nm. Some embodiments provide that the percent reflectance may be determined using ultraviolet-visible spectroscopy (UV-Vis), which may use light in the visible and/or adjacent (near-UV and near-infrared (NIR)) ranges to measure reflectance. As illustrated, each of the plots 244A-C correspond to red phosphor compositions including respectively increased Eu concentrations. For example, plot 244A corresponds to a red phosphor composition including an Eu concentration in a range of about 0.003 to about 0.007 with an emission wavelength of about 630 nm. Plot 244B corresponds to a red phosphor composition including an Eu concentration that is increased by about eighty percent of the Eu concentration of the composition corresponding to plot 244A and having an emission wavelength of about 630 nm. Plot 244C corresponds to a red phosphor composition including an Eu concentration that is increased by about two hundred or more percent of the Eu concentration of the composition corresponding to plot 244A and having an emission wavelength of about 630 nm. As illustrated, the reflectance of the red phosphor composition decreases as the Eu concentration increases. Additionally, plot 244D illustrates the percent reflectance as a function of wavelength of a red phosphor composition including an Eu concentration that is increased by significantly more than two hundred percent of the Eu concentration of the composition corresponding to plot 244A, but at an emission wavelength of 640 nm. As illustrated, the Eu content of a red phosphor composition may be determined by measuring the diffuse reflectance thereof.

Figure 4:
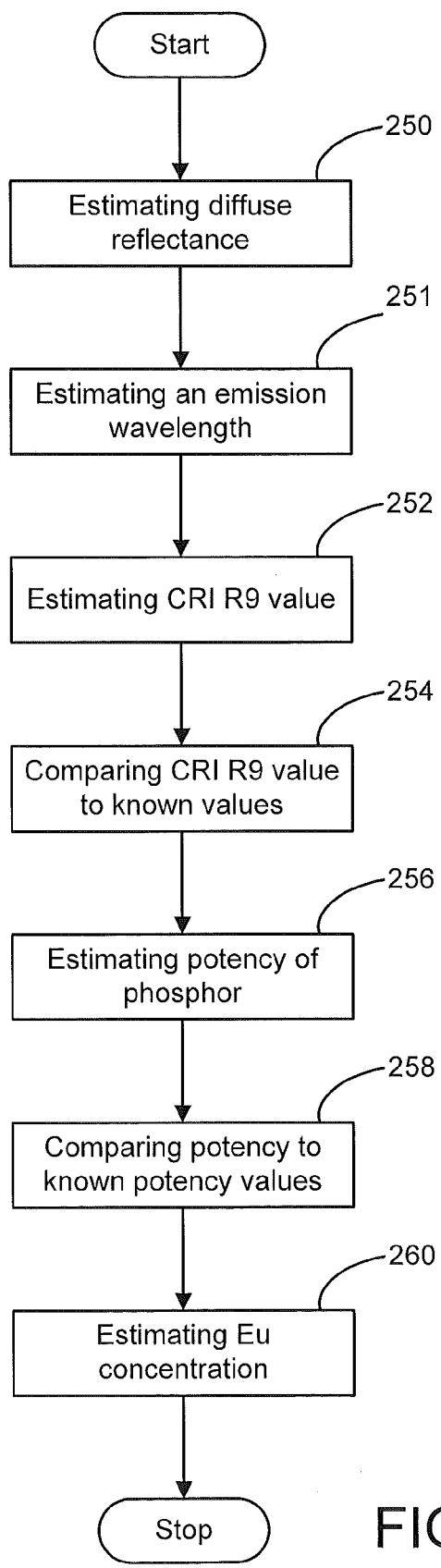
FIG. 4 is a block diagram illustrating operations for identifying a phosphor composition according to some embodiments of the present invention.

Some embodiments provide that a red phosphor composition may be identified using methods and/or operation described herein. For example, reference is now made to FIG. 4, which is a block diagram illustrating operations for identifying a red phosphor composition according to some embodiments described herein. As discussed above regarding FIG. 3, the diffuse reflectance of a red phosphor composition may be estimated (block 250). For example, UV-Vis technology may be used to determine the reflectance of the red phosphor composition.

Some embodiments provide that the wavelength of the light emitted from the red phosphor composition may be estimated (block 251). In some embodiments, the diffuse reflectance and the wavelength values may be compared to respective values of known phosphor compositions to determine if the red phosphor composition is one of the known phosphor compositions.

Using the measured diffuse reflectance, the wavelength, and/or results of comparisons to known values, the CRI R9 value corresponding to the red phosphor composition may be estimated (block 252). In some embodiments, estimating the CRI R9 value is performed based on predetermined values of the CRI R9 value that are determined to correspond to the measured diffuse reflectance. As used herein, predetermined values may be determined by correlations that may be obtained from precalculated values, or from predetermined mathematical relationships, which in some cases, may be shown in graphical form. In some embodiments, the predetermined values are stored in a look up table. Some embodiments provide that estimating the CRI R9 value may include directing light having a first dominant wavelength to the red phosphor composition and estimating the CRI R9 value emitted from the red phosphor composition.

The CRI R9 values may be compared to values of known red phosphor compositions to determine if the red phosphor composition is one of the known red phosphor compositions (block 254). For example, data corresponding to previously analyzed red phosphor compositions may be captured and stored for such comparisons among others. In some embodiments, a potency of the red phosphor composition may be estimated (block 256). Some embodiments provide that the potency of the red phosphor composition may refer to a conversion efficiency of the red phosphor. The conversion efficiency may refer to the percentage of received light that is downconverted into light that is emitted from the red phosphor. In this regard, the potency may determine how much of a red phosphor composition is used in a device to provide a desired combined light output therefrom. For example, less of a red phosphor having a higher potency may be used than of a red phosphor having a lower potency to obtain the same emission performance.

The potency may be compared to predetermined potency values of known red phosphor compositions to determine if the red phosphor composition is the same as a known red phosphor composition (block 258). In this manner, a red phosphor composition may be identified as a previously known red phosphor composition and used accordingly.

Some embodiments provide that operations include estimating an Eu concentration of the red phosphor composition based on the diffuse reflectance of the red phosphor composition and a peak wavelength of light emitted by the red phosphor composition (block 260). As discussed above regarding FIG. 3, the diffuse reflectance of red phosphor compositions varies as a function of the Eu concentration and the peak wavelength of emissions.

Methods of Making Phosphor Compositions

Also provided according to embodiments of the invention are methods of making a $Ca_{1-x-y}Sr_xEu_yAlSiN_3$ phosphor composition. In some embodiments, such methods include (a) selecting a CRI R9 value; (b) determining one or more Eu concentrations that will achieve the selected CRI R9 value based on predetermined values; and (c) making the $Ca_{1-x-y}Sr_xEu_yAlSiN_3$ phosphor having the determined Eu concentration(s). Compositions and methods described herein are also discussed in U.S. application Ser. No. 13/152,863, entitled Red Nitride Phosphors, filed Jun. 3, 2011, U.S. application Ser. No. 13/153,155, entitled Methods Of Determining And Making Red Nitride Compositions, filed Jun. 3, 2011, and U.S. application Ser. No. 12/271,945, entitled Phosphor Compositions, filed Nov. 17, 2008, and U.S. Publication No. 2010/0123104, the contents of all of which are incorporated herein by reference in their entirety.

In the methods described herein, for the $Ca_{1-x-y}Sr_xEu_yAlSiN_3$ phosphor, x and y are both between 0 and 1. In some embodiments, x is in a range of 0.50 to 0.99 and y is in a range of 0.001 to 0.025. In some embodiments, x is in a range of 0.50 to 0,99 and y is less than 0.013. In some embodiments, y is in a range of 0.001 to 0.015, and in particular embodiments, in a range of 0.001 to 0.012. In some embodiments of the invention, x is in a range of 0.70 to 0.99 and y is in a range of 0.001 and 0.025. Furthermore, in some embodiments, x is in a range of 0.71 to 0.99, and in particular embodiments, in a range of 0.70 to 0.90. In some embodiments of the invention, the Sr to Eu ratio in the $Ca_{1-x-y}Sr_xEu_yAlSiN_3$ phosphor composition is in a range of 25 to 300.

In some embodiments, the methods described herein may be used to determine Eu and Sr concentrations in $Ca_{1-x-y}Sr_xEu_yAlSiN_3$ phosphor that includes at least 1% by weight of a separate silicon aluminum oxynitride phase. In some embodiments, the silicon aluminum oxynitride phase includes $Si_2Al_4O_4N_4$.

The $Ca_{1-x-y}Sr_xEu_yAlSiN_3$ phosphor made by methods described herein may be in any suitable form, including but not limited to particles, blocks, or other known phosphor structures, including phosphor that is present as particles having an average particle size in a range of about 2 μm and 25 μm. The particles may also be in any suitable shape, including elongated, spherical and/or semi-spherical. In some embodiments, 50, 75 or 95% or more of the particles in the phosphor composition are elongated. In some embodiments, 50, 75 or 95 or more of the particles in the phosphor composition are spherical or substantially spherical.

Any suitable method may be used to form the phosphor compositions described herein. In some embodiments, such methods include mixing nitrides of calcium, strontium, aluminum and silicon with a europium source composition to form a precursor mixture, and then heating the precursor mixture in the presence of forming gas to a temperature that is sufficient to produce the phosphor but less than a temperature at which the precursor compositions or the phosphor would decompose or react with the crucible. The reaction is carried out for a time sufficient to produce a red phosphor composition that will down convert photons in the blue and ultraviolet regions of the spectrum (i.e., between about 430 and 480 mn) into photons in the longer-wavelength regions of the visible spectrum (i.e., between about 530 and 750 nm). Persons skilled in this art will recognize that the boundaries for colors in the visible spectrum are used descriptively rather than in a limiting sense.

In some embodiments, this heating of the precursor mixture is performed in the substantial absence of water and oxygen. In some embodiments, the precursor mixture is heated to a temperature in a range of 1500° C. and 1800° C.

Any suitable method of forming the phosphor compositions may be used. However, some methods that may be useful are found in U.S. patent application Ser. No. 12/271,945, filed Nov. 17, 2008, the contents of which are hereby incorporated by reference herein in their entirety. In some embodiments, the phosphor composition is formed by the following method.

Also provided according to some embodiments of the invention are light emitting devices that include a phosphor composition described herein. As such, in some embodiments, light emitting devices include a solid state lighting source and a phosphor composition according to some embodiments of the invention. In some embodiments, light emitting devices may include a solid state lighting source, a non-red phosphor and a red phosphor composition according to some embodiments of the present invention.

Solid State Light Emitting Devices

In some embodiments of the invention, provided are light emitting devices that include a solid state light emitting source a first phosphor and a red phosphor composition formed by methods described herein. A solid state light emitting device 30 will now be described with reference to FIG. 5, which is a side view of the device 30 in accordance with some embodiments of the present invention.

Figure 5:
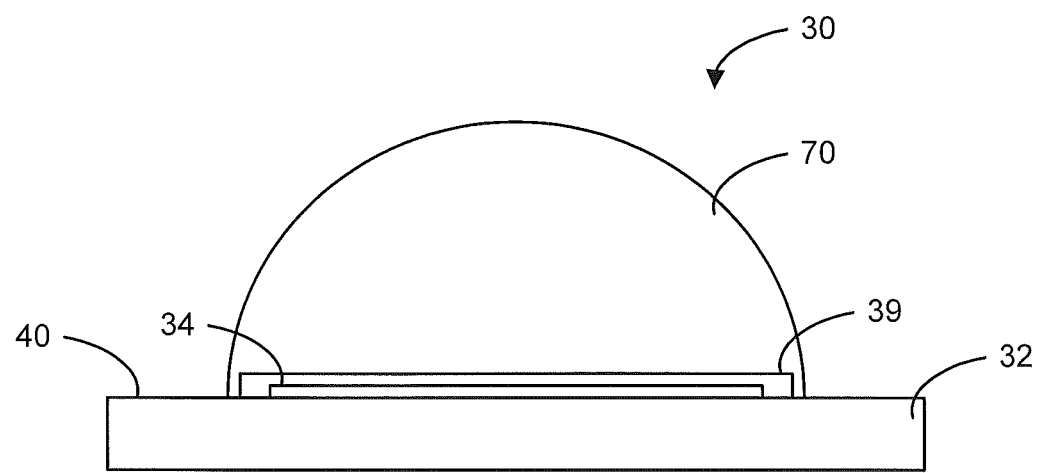
FIG. 5 is a side view of a device in accordance with some embodiments of the present invention.

As shown in FIG. 5, the solid state light emitting device 30 includes a substrate/submount ("submount") 32 on which a single LED chip or "die" 34 is mounted. The submount 32 can be formed of many different materials such as, for example, aluminum oxide, aluminum nitride, organic insulators, a printed circuit board (PCB), sapphire or silicon. The LED 34 can have many different semiconductor layers arranged in different ways. LED structures and their fabrication and operation are generally known in the art and hence are only briefly discussed herein. The layers of the LED 34 can be fabricated using known processes such as, for example, metal organic chemical vapor deposition (MOCVD). The layers of the LED 34 may include at least one active layer/region sandwiched between first and second oppositely doped epitaxial layers all of which are formed successively on a growth substrate. Typically, many LEDs are grown on a growth substrate such as, for example, a sapphire, silicon carbide, aluminum nitride (AlN), or gallium nitride (GaN) substrate to provide a grown semiconductor wafer, and this wafer may then be singulated into individual LED dies, which are mounted in a package to provide individual packaged LEDs. The growth substrate can remain as part of the final singulated LED or, alternatively, the growth substrate can be fully or partially removed. In embodiments where the growth substrate remains, it can be shaped and/or textured to enhance light extraction.

It is also understood that additional layers and elements can also be included in the LED 34, including but not limited to buffer, nucleation, contact and current spreading layers as well as light extraction layers and elements. It is also understood that the oppositely doped layers can comprise multiple layers and sub-layers, as well as super lattice structures and interlayers. The active region can comprise, for example, a single quantum well (SQW), multiple quantum well (MQW), double heterostructure or super lattice structure. The active region and doped layers may be fabricated from different material systems, including, for example, Group-III nitride based material systems such as GaN, aluminum gallium nitride (AlGaN), indium gallium nitride (InGaN) and/or aluminum indium gallium nitride (AlInGaN). In some embodiments, the doped layers are GaN and/or AlGaN layers, and the active region is an InGaN layer.

The LED 34 may be an ultraviolet, violet or blue LED that emits radiation with a dominant wavelength in a range of about 380 to about 475 nm.

The LED 34 may include a conductive current spreading structure (not illustrated) on its top surface, as well as one or more contacts 38 that are accessible at its top surface for wire bonding. The spreading structure and contacts (not illustrated) can both be made of a conductive material such as Au, Cu, Ni, In, Al, Ag or combinations thereof, conducting oxides and transparent conducting oxides. Some embodiments provide that the current spreading structure may comprise conductive fingers (not illustrated) that are arranged in a pattern on the LED 34 with the fingers spaced to enhance current spreading from the contacts into the top surface of the LED 34. In operation, an electrical signal may be applied to the contacts through a wire bond, and the electrical signal spreads through the fingers of the current spreading structure into the LED 34. Current spreading structures are often used in LEDs where the top surface is p-type, but can also be used for n-type materials.

The LED 34 may be coated with a phosphor composition 39 according to some embodiments disclosed herein. It will be understood that the phosphor composition 39 may comprise any one or more of the phosphor compositions discussed in the present disclosure.

The phosphor composition 39 may be coated on the LED 34 using many different methods, with suitable methods being described in U.S. patent applications Ser. Nos. 11/656,759 and Ser. No. 11/899,790, both entitled Wafer Level Phosphor Coating Method and Devices Fabricated Utilizing Method. Alternatively the phosphor composition 39 may be coated on the LED 34 using other methods such as an electrophoretic deposition (EPD), with a suitable EPD method described in U.S. patent application Ser. No. 11/473,089 entitled Closed Loop Electrophoretic Deposition of Semiconductor Devices.

An optical element or lens 70 may be formed on the top surface 40 of the submount 32, over the LED 34, to provide both environmental and/or mechanical protection. The lens 70 can be molded using different molding techniques such as those described in U.S. patent applications Ser. No. 11/982,275 entitled Light Emitting Diode Package and Method for Fabricating Same. The lens 70 can be many different shapes such as, for example, hemispheric. Many different materials can be used for the lens 70 such as silicones, plastics, epoxies or glass. The lens 70 can also be textured to improve light extraction and/or scattering particles. In some embodiments, the lens 70 may comprise the phosphor composition 39 and/or may be used to hold a phosphor composition 39 in place over the LED 34 instead of and/or in addition to coating a phosphor composition 39 directly onto the LED chip 34.

The solid state light emitting device 30 may comprise an LED package having different sizes or footprints. In some embodiments, the surface area of the LED chip 34 may cover more than 10% or even 15% of the surface area of the submount 32. In some embodiments, the ratio of the width of the LED chip 34 to the diameter (or width for square lens) of the lens 70 may be greater than 0.5. For example, in some embodiments, the solid state light emitting device 30 may include an LED package having a submount 32 that is approximately 3.45 mm square and a hemispherical lens having a maximum diameter of approximately 2.55 mm. The LED package may be arranged to hold an LED chip that is approximately 1.4 mm square and/or 2.0 mm square, among others. In such embodiments, the surface area of the LED chip 34 covers more than 16% of the surface area of the submount 32.

It will be appreciated that FIG. 5 illustrates one example of a packaged LED that may include phosphor compositions according to some embodiments of the present invention. Additional examples of packaged LEDs are disclosed in, for example, U.S. Provisional Patent Application No. 61/173,550, filed Apr. 28, 2009, the entire contents of which are incorporated by reference herein as if set forth in its entirety. It will likewise be appreciated that the phosphor compositions according to embodiments of the present invention may be used with any other packaged LED structures.

According to some embodiments, the phosphor composition 39 may include, among others, a $Ca_{1-x-y}Sr_xEu_yAlSiN_3$ red phosphor composition that, in combination with the LED and other phosphors, emits light contributing to a specific Color Rendering Index (CRI) R9 value corresponding to a given Eu concentration. Some embodiments provide that the light emitted from the red phosphor composition corresponds to absorbed light from the LED and one or more additional phosphors and/or light conversion materials. In some embodiments, the Eu concentration of the red phosphor is negatively correlated with the CRI R9 value. The CRI R9 value of the red phosphor composition may be determined by estimating a diffuse reflectance of the red phosphor composition and a peak wavelength of light emitted by the red phosphor composition. For example, as discussed above regarding FIG. 3, the diffuse reflectance of red phosphors emitting given peak wavelengths may have a significant correlation to the Eu concentration in the red phosphor composition. As such, the Eu concentration of the red phosphor composition may be determined by estimating the diffuse reflectance of the red phosphor composition and determining a peak wavelength of light emitted by the red phosphor composition.

Based on the correlation therebetween, the Eu concentration of the red phosphor composition may be determined based on predetermined values that are selected to obtain the specific CRI R9 value of the combined emission of the LED 34, one or more other phosphors and the red phosphor composition. As discussed above, an increase in the CRI R9 value may correspond to a decrease in a potency of the red phosphor composition that determines a conversion efficiency of the red phosphor composition. In this regard, some embodiments provide that both the CRI R9 value and the potency may be used to determine the Eu concentration of the red phosphor composition.

Although the above described device illustrate an LED 34 coated with a phosphor 39 after being mounted to a submount 32, this is merely exemplary. For example some embodiments provide that the phosphor compositions according to embodiments disclosed herein may be directly coated onto a surface of a semiconductor wafer before the wafer is singulated into individual LED chips. For example, the phosphor composition may be coated onto a plurality of LED chips.

Different factors determine the amount of LED light that will be absorbed by the phosphor composition coating 39 in the final LED chips 34, including but not limited to the size of the phosphor particles, the percentage of phosphor loading, the type of binder material, the efficiency of the match between the type of phosphor and wavelength of emitted light, and the thickness of the phosphor composition coating 39. It will be understood that many other phosphors can used alone or in combination to achieve the desired combined spectral output.

Different sized phosphor particles can be used including, but not limited to, 10-100 nanometer (nm)-sized particles to 20-30 μm sized particles, or larger. Smaller particle sizes typically scatter and mix colors better than larger sized particles to provide a more uniform light. Larger particles are typically more efficient at converting light compared to smaller particles, but emit a less uniform light. In some embodiments, the phosphor particles may range in size from about 1 micron to about 30 microns, with about half of the particles being from between about 4 microns to about 20 microns. In some embodiments, at least half of the particles of the phosphors may have a size (diameter) in the range between 2 microns and 20 microns. Different sized phosphors can be included in the phosphor composition coating 39 as desired before it is applied such that the end coating can have the desired combination of smaller sizes to effectively scatter and mix the light, and larger sizes to efficiently convert the light.

The coating can also have different concentrations or loading of phosphor materials in the binder, with a typical concentration being in range of 30-75% by weight. In one embodiment, the phosphor concentration is approximately 65% by weight, and is may be generally uniformly dispersed throughout the binder. In other embodiments the coating can comprise multiple layers of different concentrations or types of phosphors, and the multiple layers can comprise different binder materials. One or more of the layers can be provided without phosphors. For example, a first coat of clear silicone can be deposited followed by phosphor loaded layers. As another example, the coating may comprise, for example, a two layer coating that includes a first layer having one type of phosphor on the LED chips 34, and a second layer directly on the first layer that includes a second type of phosphor. Numerous other layer structures are possible, including multi-layers that include multiple phosphors in the same layer, and intervening layers or elements could also be provided between layers and/or between the coating and the underlying LED chips 34.

It will be appreciated that numerous fabrication methods are available. For example, U.S. patent application Ser. No. 11/899,790, filed Sep. 7, 2007 (U.S. Patent Application Publication No. 2008/0179611), the entire contents of which are incorporated herein by reference, discloses various additional methods of coating a phosphor composition coating onto a solid state light emitting device. In still other embodiments, light emitting devices an LED chip that may be mounted on a reflective cup by means of a solder bond or conductive epoxy, and the phosphor composition may comprise an encapsulant material such as, for example, silicone that has the phosphors suspended therein. This phosphor composition may be used, for example, to partially or completely fill the reflective cup.

It is understood that although the present invention has been described with respect to LEDs having vertical geometries, it may also be applied to LEDs having other geometries such as, for example, to lateral LEDs that have both contacts on the same side of the LED chip.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination. Computer Program Products Also provided herein are computer program products for determining one or more concentrations of Eu in a $Ca_{1-x-y}Sr_xEu_yAlSiN_3$ phosphor that will achieve a selected Color Rendering Index R9 value. Such products include computer readable program code configured to perform operations corresponding to methods according to embodiments Computer program code for carrying out operations of data processing systems discussed above with respect to the figures may be written in a high-level programming language, such as Java, C, and/or C++, for development convenience. In addition, computer program code for carrying out operations of embodiments of the present invention may also be written in other programming languages, such as, but not limited to, interpreted languages.

While embodiments of the present invention have primarily been discussed above with respect to solid state light emitting devices that include LEDs, it will be appreciated that according to further embodiments of the present invention, laser diodes and/or other solid state lighting devices may be provided that include the phosphor compositions discussed above. Thus, it will be appreciated that embodiments of the present invention are not limited to LEDs, but may include other solid state lighting devices such as laser diodes.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting device, comprising:
   a solid state lighting source;
   a first phosphor composition that is configured to emit first emitted light at a first emission wavelength; and
   a second phosphor composition that is configured to emit second emitted light at a second emission wavelength that is different from the first emission wavelength and that is different from a wavelength of light emitted from the solid state lighting source, the second phosphor composition including a first activator concentration that results in a first specific saturated color coefficient value and a first general saturated color coefficient value of a combined emission of the light emitted from the solid state lighting source, the first emitted light and the second emitted light,
   wherein the first specific saturated color coefficient value is greater than a second specific saturated color coefficient value of another device that is substantially the same as the light emitting device with the exception of having a third phosphor instead of the second phosphor, the third phosphor comprising a third phosphor composition having substantially a same composition as the second phosphor composition except the second activator concentration is greater than the first activator concentration and having a second general saturated color coefficient value that is substantially the same as the first general saturated color coefficient value.

2. The device according to claim 1, wherein the light emitted from the solid state lighting source includes a dominant wavelength in a range of about 380 to about 470 nm, and
   wherein the second emission wavelength includes a dominant wavelength in a range of about 530 to about 565 nm.

3. A light emitting device, comprising:
   a solid state lighting source;
   a first phosphor composition that is configured to emit first emitted light at a first emission wavelength; and
   a second phosphor composition that is configured to emit second emitted light at a second emission wavelength that is different from the first emission wavelength and that is different from a wavelength of light emitted from the solid state lighting source, the second phosphor composition including an activator concentration that results in a specific saturated color coefficient value of a combined emission of the light emitted from the solid state lighting source, the first emitted light and the second emitted light wherein the second phosphor composition includes a $Ca_{1-x-y}Sr_xEu_yAlSiN_3$ phosphor composition, and
   wherein the specific saturated color coefficient value is greater than that of another device that is substantially the same as the light emitting device with the exception of having a third phosphor composition instead of the second phosphor composition wherein the third phosphor composition is configured to emit light at the second emission wavelength when excited by light having a same wavelength as the light emitted from the solid state lighting source, the third phosphor composition having substantially a same composition as the second phosphor composition except the third phosphor composition includes the $Ca_{1-x-y}Sr_xEu_yAlSiN_3$ phosphor composition having a greater concentration of the activator than the second phosphor composition.

4. The device according to claim 3, wherein y is in a range from about 0 to about 0.025, and
   wherein the specific saturated color coefficient value comprises a Color Rendering Index (CRI) R9 value in a range of about 0 to about 80.

5. The device according to claim 3, wherein the $Ca_{1-x-y}Sr_xEu_yAlSiN_3$ phosphor composition emits light including a wavelength at peak frequencies of emitted light of about 630 nm, wherein y is in a range of about 0.002 to about 0.007, and wherein the specific saturated color coefficient value comprises a Color Rendering Index (CRI) R9 value of about 20.

6. The device according to claim 5, wherein the third phosphor composition comprises $Ca_{1-x-y}Sr_xEu_yAlSiN_3$ with an about eighty percent increase in y relative to the second phosphor composition and about a fifty percent decrease in the CRI R9 value without a substantial change in a general CRI value relative to that of the combined emission.

7. The device according to claim 5, wherein the third phosphor composition comprises $Ca_{1-x-y}Sr_xEu_yAlSiN_3$ with an about two hundred percent increase in y relative to the second phosphor composition and about a one hundred percent decrease in the CRI R9 value without a substantial change in a general CRI value relative to that of the combined emission.

8. The device according to claim 3, wherein the $Ca_{1-x-y}Sr_xEu_yAlSiN_3$ phosphor composition emits light including a wavelength at peak frequencies of emitted light of about 630 nm and y is in a range of about 0.005 to about 0.012, and wherein the specific saturated color coefficient value comprises a Color Rendering Index (CRI) R9 value in a range of about 20 to about zero as a function of y.

9. The device according to claim 3, wherein the activator comprises Eu and wherein the specific saturated color coefficient value comprises a Color Rendering Index (CRI) R9 value.

10. The device according to claim 9, wherein the Eu concentration is negatively correlated with the CRI R9 value.

11. The device according to claim 3, wherein a diffuse reflectance of the second phosphor composition and a wavelength at peak frequencies of the second emitted light are indicative of the specific saturated color coefficient value.

12. The device according to claim 3, wherein a diffuse reflectance of the second phosphor composition and a wavelength at peak frequencies of the second emitted light are indicative of a concentration of the activator in the second phosphor composition.

13. The device according to claim 3, wherein the activator concentration has a greater contribution to the specific saturated color coefficient value than the light emitted from solid state lighting source and the first emitted light.

14. The device according to claim 3, wherein a potency of the second phosphor composition that determines a conversion efficiency of the second phosphor composition is less than that of the third phosphor composition.

15. The device according to claim 3, wherein a load factor that corresponds to a relative amount of the second phosphor composition in the device is negatively correlated to an Eu concentration in the second phosphor composition to provide a substantially same specific saturated color coefficient value.

16. The device according to claim 3, wherein a same desired specific saturated color coefficient value corresponds to less of the second phosphor composition than the third phosphor composition having the greater activator concentration.

17. The device according to claim 3, wherein the $Ca_{1-x-y}Sr_xEu_yAlSiN_3$ phosphor composition emits light including a wavelength at peak frequencies of emitted light of about 630 nm,
wherein the specific saturated color coefficient value comprises a Color Rendering Index (CM) R9 value, and
wherein the third phosphor composition comprises $Ca_{1-x-y}Sr_xEu_yAlSiN_3$ with an increase of y of about 0.001 relative to the second phosphor composition and a decrease relative to the CRI R9 value in a range of about 3 to about 5 as a function of y.

18. A light emitting device, comprising:
a solid state lighting source;
a first phosphor composition positioned to receive light emitted from the solid state lighting source and to emit first emitted light; and
a second phosphor composition comprising $Ca_{1-x-y}Sr_xEu_yAlSiN_3$ and configured to receive light that is emitted from the solid state lighting source and to emit second emitted light,
wherein a Color Rendering Index (CRI) R9 value of a combination of the light emitted from the solid state light emitter, the first emitted light and the second emitted light is greater than that of another device that is substantially the same as the light emitting device with the exception of having a third phosphor composition instead of the second phosphor composition, the third phosphor composition comprising a $Ca_{1-x-y}Sr_xEu_yAlSiN_3$ phosphor composition having a greater Eu concentration than the second phosphor composition.

19. The device according to claim 18, wherein the Eu concentration of the second phosphor composition further corresponds to a selected potency that determines a conversion efficiency of the second phosphor composition, and wherein a potency of the $Ca_{1-x-y}Sr_xEu_yAlSiN_3$ phosphor composition having the greater Eu concentration is greater than the selected potency.

20. The device according to claim 18, wherein the second phosphor composition comprising $Ca_{1-x-y}Sr_xEu_yAlSiN_3$ emits light including a wavelength at peak frequencies of emitted light of about 630 nm and a y value is in a range of about 0.003 to about 0.015, and wherein the CRI R9 value is in a range of about 20 to about zero corresponding to the y value.

21. The device according to claim 18, wherein the Eu concentration is negatively correlated with the CRI R9 value.

22. The device according to claim 18, wherein a diffuse reflectance of the second phosphor composition and a wavelength at peak frequencies of the second emitted light are indicative of the Eu concentration in the second phosphor composition.

23. The device according to claim 18, wherein the second phosphor composition comprising $Ca_{1-x-y}Sr_xEu_yAlSiN_3$ emits light including a wavelength at peak frequencies of emitted light of about 630 nm, wherein y is in a range of about 0.003 to about 0.007, and wherein the CRI R9 value is in a range of about 18 to about 22.

24. The device according to claim 23, wherein the $Ca_{1-x-y}Sr_xEu_yAlSiN_3$ phosphor composition having the greater Eu concentration comprises an about eighty percent increase in y relative to the second phosphor composition and an about fifty percent decrease in the CRI R9 value.

25. The device according to claim 18,
wherein the combination of the light emitted from the solid state light emitter, the first emitted light and the second emitted light is visually indistinguishable from a center point of a region in two-dimensional color space, and
wherein the two-dimensional color space includes a 1931 CIE Chromaticity Diagram and wherein the center point corresponds to a ccx value in a range of about 0.335 to about 0.480 and a ccy value in a range of about 0.335 to about 0.435.

26. The device according to claim 25, wherein the center point corresponds to a ccx value in a range of about 0.414 to about 0.485 and a ccy value in a range of about 0.380 to about 0.435.

* * * * *